(12) United States Patent
Hsieh et al.

(10) Patent No.: US 9,406,902 B2
(45) Date of Patent: Aug. 2, 2016

(54) FLEXIBLE DISPLAY PANEL HAVING FOLDING AREAS AND NON-FOLDING AREAS

(75) Inventors: Ming-Che Hsieh, Taipei (TW); Shih-Hsing Hung, Hsinchu County (TW); Chih-Jen Hu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 353 days.

(21) Appl. No.: 13/316,575

(22) Filed: Dec. 12, 2011

(65) Prior Publication Data

US 2012/0154707 A1    Jun. 21, 2012

(30) Foreign Application Priority Data

Dec. 15, 2010  (TW) ................. 99144061 A

(51) Int. Cl.
*G02F 1/1333* (2006.01)
*G02F 1/1339* (2006.01)
*G02F 1/167* (2006.01)
*H01L 51/52* (2006.01)
*H01L 51/00* (2006.01)

(52) U.S. Cl.
CPC .......... *H01L 51/5246* (2013.01); *G02F 1/1333* (2013.01); *H01L 51/0097* (2013.01); *G02F 1/1339* (2013.01); *G02F 1/133305* (2013.01); *G02F 1/167* (2013.01); *Y02E 10/549* (2013.01)

(58) Field of Classification Search
USPC .................................................. 349/60, 153
See application file for complete search history.

(56) References Cited

U.S. PATENT DOCUMENTS

| 7,075,703 | B2 | 7/2006 | O'Neil et al. |
| 7,440,070 | B2 | 10/2008 | Seok et al. |
| 2002/0027636 | A1* | 3/2002 | Yamada ................. 349/155 |
| 2006/0291034 | A1 | 12/2006 | Patry et al. |
| 2007/0152956 | A1 | 7/2007 | Danner et al. |
| 2007/0211002 | A1 | 9/2007 | Zehner et al. |
| 2008/0123187 | A1* | 5/2008 | Son ........................ 359/452 |
| 2009/0021666 | A1 | 1/2009 | Chen |
| 2011/0007042 | A1* | 1/2011 | Miyaguchi ............. 345/204 |

FOREIGN PATENT DOCUMENTS

| JP | 60-247619 | 12/1985 |
| JP | 06-102518 | 4/1994 |
| JP | 2006-039124 | 2/2006 |
| WO | 2006126158 | 11/2006 |

* cited by examiner

*Primary Examiner* — Lauren Nguyen
(74) *Attorney, Agent, or Firm* — Jianq Chyun IP Office

(57) ABSTRACT

A flexible display panel includes a first flexible substrate, a second flexible substrate, a display medium, and a sealant. The first flexible substrate has a plurality of non-folding areas and at least one folding area located between the non-folding areas. The non-folding areas are separated. The second flexible substrate is configured above the first flexible substrate. The display medium is configured between the first flexible substrate and the second flexible substrate. The sealant is configured on the first flexible substrate to surround the display medium. The elasticity of the sealant in the folding area is greater than the elasticity of the sealant in the non-folding areas.

20 Claims, 9 Drawing Sheets

FLEXIBLE DISPLAY PANEL HAVING FOLDING AREAS AND NON-FOLDING AREAS

CROSS-REFERENCE TO RELATED APPLICATION

This application claims the priority benefit of Taiwan application serial no. 99144061, filed on Dec. 15, 2010. The entirety of the above-mentioned patent application is hereby incorporated by reference herein and made a part of this specification.

BACKGROUND OF THE INVENTION

1. Field of the Invention

The invention relates to a display panel. More particularly, the invention relates to a flexible display panel.

2. Description of Related Art

With rapid development of display technologies, conventional cathode ray tube (CRT) displays have been gradually replaced by flat panel displays (FPD). In comparison with the FPD having a solid carrier (e.g., a glass substrate), a flexible display in which an active device is formed on a flexible substrate has been developed according to recent researches because the flexible substrate (e.g., a plastic substrate) is characterized by flexibility and impact endurance.

Generally, in the process of manufacturing a flexible display, a sealant is spread between an active device substrate and an opposite substrate, the active device substrate and the opposite substrate are laminated, a display medium is injected between the active device substrate and the opposite substrate, and a sealing process is then performed. In most cases, the sealant is thermal curable resin or ultraviolet curable sealant which is cured after the two substrates are heated and laminated. However, the flexible display cannot be easily bent due to the cured sealant. Moreover, excessive stress applied to the cured sealant may result in damages to the cured sealant when the flexible display is bent, thus impairing reliability of the product.

SUMMARY OF THE INVENTION

The invention is directed to a flexible display panel that can be bent without damaging a sealant used for sealing a display medium.

In an embodiment of the invention, a flexible display panel includes a first flexible substrate, a second flexible substrate, a display medium, and a sealant. The first flexible substrate has a plurality of non-folding areas and at least one folding area located between the non-folding areas. The non-folding areas are separated. The second flexible substrate is configured above the first flexible substrate. The display medium is configured between the first flexible substrate and the second flexible substrate. The sealant is configured on the first flexible substrate to surround the display medium. The elasticity of the sealant in the folding area is greater than the elasticity of the sealant in the non-folding areas.

According to an embodiment of the invention, the sealant includes a plurality of first portions and a plurality of second portions. The first portions are separated. Besides, the first portions are distributed in the non-folding areas. The second portions are connected to the first portions and distributed in the folding area. The first portions and the second portions together constitute a close-ended ring-shaped pattern, and a material of the first portions is different from a material of the second portions.

According to an embodiment of the invention, the display medium is liquid crystal, an electrophoresis display layer, or an organic electro-luminescence device (OELD) layer, for instance.

According to an embodiment of the invention, the first portions are not distributed in the foldable area, for instance.

According to an embodiment of the invention, a connection region between the first portions and the second portions is located at the boundary of the foldable area, for instance.

According to an embodiment of the invention, the second portions are exclusively distributed in the foldable area, for instance.

According to an embodiment of the invention, the Young's modulus of the first portions is greater than the Young's modulus of the second portions, for instance.

According to an embodiment of the invention, the Young's modulus of the first portions ranges from about 1000 MPa to about 10000 MPa, for instance, and the Young's modulus of the second portions ranges from about 10 MPa to about 1000 MPa, for instance.

According to an embodiment of the invention, the Young's modulus of the first portions ranges from about 3000 MPa to about 8000 MPa, for instance, and the Young's modulus of the second portions ranges from about 50 MPa to about 500 MPa, for instance.

According to an embodiment of the invention, the first portions are located between the first flexible substrate and the second flexible substrate, for instance, or the first portions are located on the first flexible substrate and cover a sidewall of the display medium and a sidewall of the second flexible substrate, for instance.

According to an embodiment of the invention, the second portions are located between the first flexible substrate and the second flexible substrate, for instance.

According to an embodiment of the invention, the second portions are located on the first flexible substrate and cover a sidewall of the display medium and a sidewall of the second flexible substrate, for instance.

According to an embodiment of the invention, each of the second portions is, for instance, a double sided tape located between the first flexible substrate and the second flexible substrate.

According to an embodiment of the invention, each of the second portions is a flexible tape, for instance.

According to an embodiment of the invention, each of the second portions includes a double sided tape and a sealing material. The double sided tape is located between the first flexible substrate and the second flexible substrate. The sealing material is located on the first flexible substrate and covers a sidewall of the display medium and a sidewall of the second flexible substrate. The Young's modulus of the sealing material is smaller than the Young's modulus of the first portions.

According to an embodiment of the invention, a width of each of the first portions is smaller than a width of each of the second portions, for instance.

According to an embodiment of the invention, the sealant includes a ring-shaped portion and a plurality of auxiliary portions. The ring-shaped portion surrounds the display medium. The auxiliary portions cover the ring-shaped portion and are distributed in the foldable area. A material of the ring-shaped portion is different from a material of each of the auxiliary portions.

According to an embodiment of the invention, the auxiliary portions are exclusively distributed in the foldable area, for instance.

According to an embodiment of the invention, the Young's modulus of the ring-shaped portion is greater than the Young's modulus of each of the auxiliary portions, for instance.

According to an embodiment of the invention, the Young's modulus of the ring-shaped portion ranges from about 1000 MPa to about 10000 MPa, for instance, and the Young's modulus of each of the auxiliary portions ranges from about 10 MPa to about 1000 MPa, for instance.

According to an embodiment of the invention, the Young's modulus of the ring-shaped portion ranges from about 3000 MPa to about 8000 MPa, for instance, and the Young's modulus of each of the auxiliary portions ranges from about 50 MPa to about 500 MPa, for instance.

According to an embodiment of the invention, the ring-shaped portion located in the foldable area has a first width, for instance. The ring-shaped portion located in the non-foldable areas has a second width, for instance. The first width is smaller than or substantially equal to the second width.

According to an embodiment of the invention, the ring-shaped portion is located between the first flexible substrate and the second flexible substrate, for instance.

According to an embodiment of the invention, each of the auxiliary portions is a sealing material, for instance.

According to an embodiment of the invention, each of the sealing materials is located between the first flexible substrate and the second flexible substrate, for instance, or each of the sealing materials is located on the first flexible substrate and covers a sidewall of the display medium and a sidewall of the second flexible substrate, for instance.

According to an embodiment of the invention, the ring-shaped portion is located on the first flexible substrate and covers a sidewall of the display medium and a sidewall of the second flexible substrate, for instance.

According to an embodiment of the invention, each of the auxiliary portions is a sealing material, for instance.

According to an embodiment of the invention, each of the sealing materials is located on the first flexible substrate and covers a sidewall of the display medium and a sidewall of the second flexible substrate, for instance.

According to an embodiment of the invention, each of the auxiliary portions is a flexible tape, for instance.

According to an embodiment of the invention, each of the flexible tapes covers the ring-shaped portion located in the foldable area.

According to an embodiment of the invention, the ring-shaped portion is a ring-type double sided tape, for instance. Each of the auxiliary portions includes a sealing material located on the first flexible substrate and covering a sidewall of the ring-type double sided tape and a sidewall of the second flexible substrate, for instance. The Young's modulus of the sealing material is smaller than the Young's modulus of the ring-shaped portion.

Based on the above, in the flexible display panel described in the embodiments of the invention, the elasticity of the sealant located in the foldable area is greater than the elasticity of the sealant located in the non-foldable areas. Hence, when the flexible display panel is bent, the sealant located in the foldable area is not damaged by stress.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
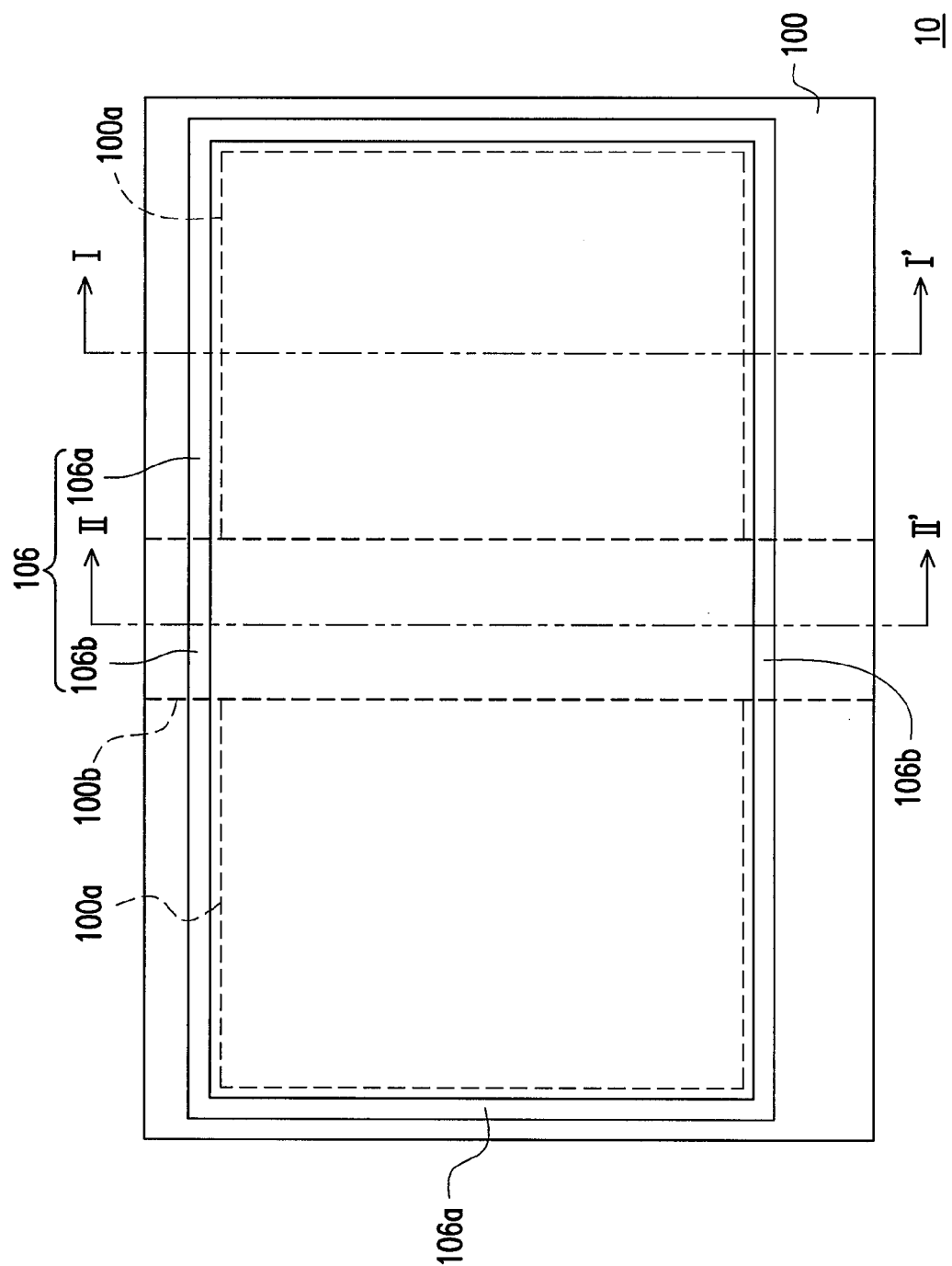
FIG. 1A is a schematic top view illustrating a flexible display panel according to an embodiment of the invention.
Figure 1B:
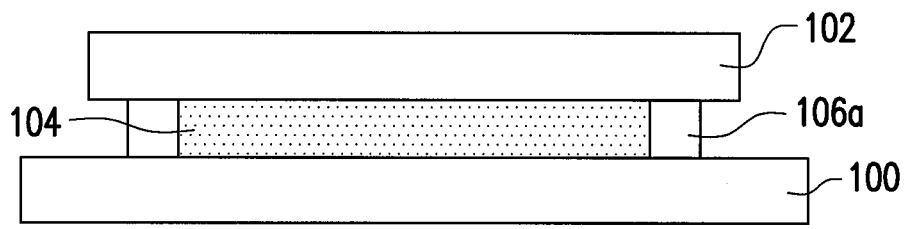
FIG. 1B is a schematic cross-sectional view illustrating the flexible display panel taken along a section I-I' depicted in FIG. 1A.
Figure 1C:
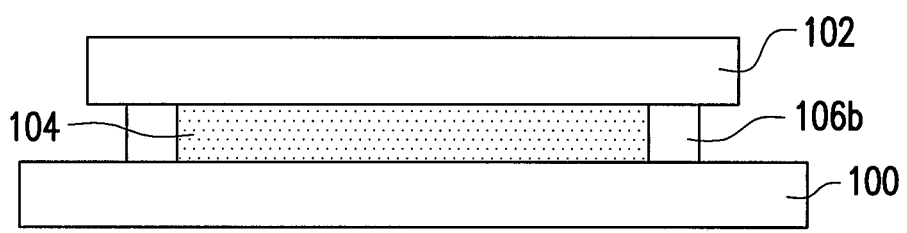
FIG. 1C is a schematic cross-sectional view illustrating the flexible display panel taken along a section II-II' depicted in FIG. 1A.

FIG. 1A is a schematic top view illustrating a flexible display panel according to an embodiment of the invention. FIG. 1B is a schematic cross-sectional view illustrating the flexible display panel taken along a section I-I' depicted in FIG. 1A. FIG. 1C is a schematic cross-sectional view illustrating the flexible display panel taken along a section II-II' depicted in FIG. 1A. To clearly illustrate the invention, an upper substrate and a display medium located between the upper substrate and a lower substrate are omitted in FIG. 1A. With reference to FIG. 1A, FIG. 1B, and FIG. 1C, the flexible display panel 10 includes a first flexible substrate 100, a second flexible substrate 102, a display medium 104, and a sealant 106. The second flexible substrate 102 is configured above the first flexible substrate 100. The first flexible substrate 100 and the second flexible substrate 102 are plastic substrates, for instance. The display medium 104 is configured between the first flexible substrate 100 and the second flexible substrate 102. Here, the display medium 104 is liquid crystal, an electrophoresis display layer, or an OLED layer, for instance. Namely, the flexible display panel 10 can be a liquid crystal display (LCD) panel, an electrophoresis display panel, or an OLED panel. The sealant 106 is configured on the first flexible substrate 100 to surround the display medium 104. That is to say, in the flexible display panel 10, the display medium 104 is sealed between the first flexible substrate 100 and the second flexible substrate 102 by the sealant 106.

In this embodiment, the first flexible substrate 100 has two non-foldable areas 100a that are separated from each other and a foldable area 100b located between the non-foldable areas 100a. The non-foldable areas 100a are image display areas, for instance. Based on actual design requirements, the first flexible substrate 100 can have a plurality of non-foldable areas 100a separated from one another and a plurality of foldable areas 100b located among the non-foldable areas 100a.

The sealant 106 is further described below.

To prevent the sealant 106 in the foldable area 100b from being damaged by the excessive stress when the flexible display panel 10 is bent, the elasticity of the sealant 106 in the foldable area 100b needs to be greater than the elasticity of the sealant 106 in the non-foldable areas 100a according to this embodiment. Specifically, the sealant 106 includes a plurality of first portions 106a separated from one another and a plurality of second portions 106b. The first portions 106a are distributed in the non-foldable areas 100a but not distributed in the foldable area 100b. The second portions 106b are exclusively distributed in the foldable area 100b. The second portions 106b are connected to the first portions 106a, and a connection region between the first portions 106a and the second portions 106b is located at the boundary of the foldable area 100b, so as to form a close-ended ring-shaped pattern. Besides, a material of the first portions 106a is different from a material of the second portions 106b. Since the elasticity of the sealant 106 in the foldable area 100b needs to be greater than the elasticity of the sealant 106 in the non-foldable areas 100a, the Young's modulus of the first portions 106a needs to be greater than the Young's modulus of the second portions 106b. The Young's modulus of the first portions 106a ranges from about 1000 MPa to about 10000 MPa, for instance, preferably from about 3000 MPa to about 8000 MPa. The Young's modulus of the second portions 106b ranges from about 10 MPa to about 1000 MPa, for instance, preferably from about 50 MPa to about 500 MPa. The material of the first portions 106a is epoxy or silicon, for instance. The material of the second portions 106b is acrylic, silicon or rubber, for instance. The materials of the first and second are not limited to those mentioned above. For instance, the material of the first portions 106a is styrenic block copolymer, ethylene vinyl-acetate or amorphous poly-olefin. The material of the second portions 106b is epoxy mixed with rubber, silicon or acrylic, etc. Alternatively, the second portions 106b can also be double sided tapes or flexible tapes.

According to this embodiment, the elasticity of the second portions 106b of the sealant 106 in the foldable area 100b is greater than the elasticity of the first portions 106a of the sealant 106 in the non-foldable areas 100a. Hence, when the flexible display panel 10 is bent, the second portions 106b located in the foldable area 100b are not damaged by excessive stress. Thereby, moisture does not enter the flexible display panel 10, and reliability of the product is not deteriorated.

Moreover, to well prevent moisture from entering the flexible display panel 10, the width of the sealant 106 in the foldable area 100b can be greater than the width of the sealant 106 in the non-foldable areas 100a according to another embodiment of the invention.

Figure 2:
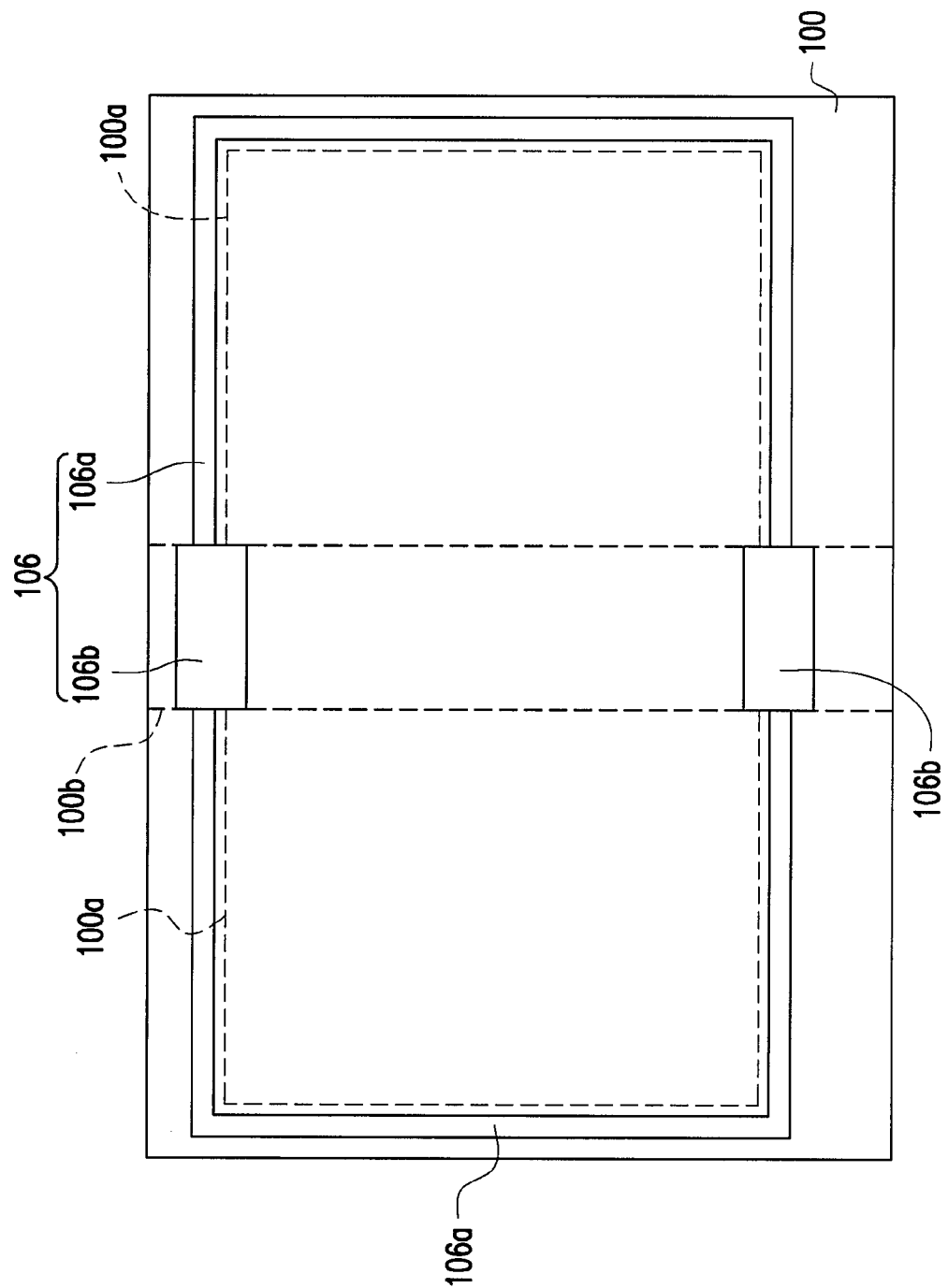
FIG. 2 is a schematic top view illustrating a flexible display panel according to another embodiment of the invention.

FIG. 2 is a schematic top view illustrating a flexible display panel according to another embodiment of the invention. With reference to FIG. 2, in this embodiment, the width of each of the second portions 106b is greater than the width of each of the first portions 106a. Therefore, moisture can be effectively prevented from entering the flexible display panel 10, and reliability of the product can be further improved.

In the previous embodiments, the first portions 106a and the second portions 106b are located between the first flexible substrate 100 and the second flexible substrate 102, which should not be construed as a limitation to the invention.

Figure 3A:
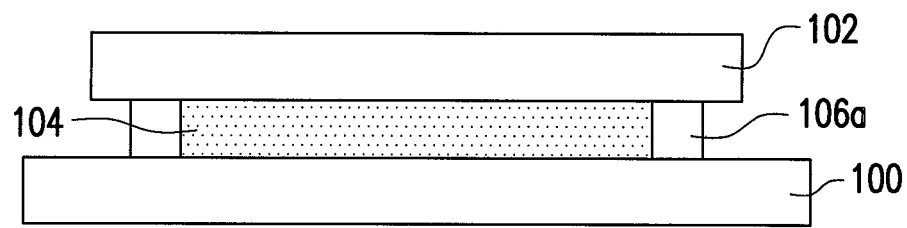
FIG. 3A is a schematic cross-sectional view illustrating the flexible display panel taken along the section I-I' depicted in FIG. 1A according to another embodiment of the invention.
Figure 3B:
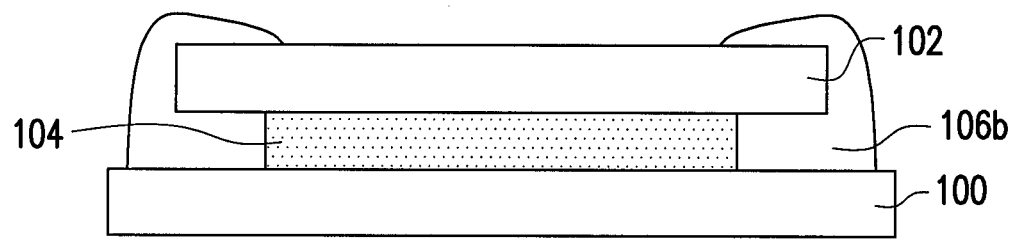
FIG. 3B is a schematic cross-sectional view illustrating the flexible display panel taken along the section II-II' depicted in FIG. 1A according to another embodiment of the invention.

FIG. 3A is a schematic cross-sectional view illustrating the flexible display panel taken along the section I-I' depicted in FIG. 1A according to another embodiment of the invention. FIG. 3B is a schematic cross-sectional view illustrating the flexible display panel taken along the section II-II' depicted in FIG. 1A according to another embodiment of the invention. With reference to FIG. 3A and FIG. 3B, in this embodiment, the first portions 106a are located between the first flexible substrate 100 and the second flexible substrate 102, and the second portions 106b are located on the first flexible substrate 100 and cover a sidewall of the display medium 104 and a sidewall of the second flexible substrate 102.

Similar to the second portions 106b depicted in FIG. 3B, the first portions 106b can be located on the first flexible substrate 100 and cover the sidewall of the display medium 104 and the sidewall of the second flexible substrate 102 in another embodiment of the invention. Here, the second portions 106b are located between the first flexible substrate 100 and the second flexible substrate 102. Alternatively, the first and second portions 106a and 106b can be both located on the first flexible substrate 100 and cover the sidewall of the display medium 104 and the sidewall of the second flexible substrate 102 in another embodiment of the invention.

Besides, the second portions 106b described in another embodiment can also be made of single material or at least two different materials.

Figure 4:
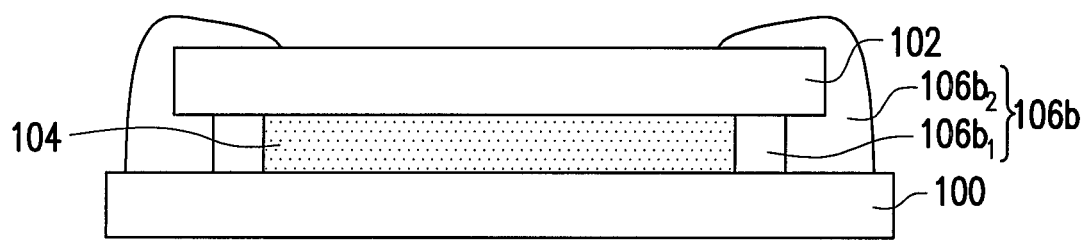
FIG. 4 is a schematic cross-sectional view illustrating the flexible display panel taken along the section II-II' depicted in FIG. 1A according to another embodiment of the invention.

FIG. 4 is a schematic cross-sectional view illustrating the flexible display panel taken along the section II-II' depicted in FIG. 1A according to another embodiment of the invention. With reference to FIG. 4, the second portions 106b include double sided tapes $106b_1$ and sealing materials $106b_2$. The double sided tapes $106b_1$ are located between the first flexible substrate 100 and the second flexible substrate 102, and the sealing materials $106b_2$ are located on the first flexible substrate 100 and cover the sidewall of the display medium 104 and the sidewall of the second flexible substrate 102. Note that the Young's modulus of the sealing materials $106b_2$ needs to be smaller than the Young's modulus of the first portions 106a in this embodiment. In other words, the elasticity of the second portions 106b which include the double sided tapes $106b_1$ and the sealing materials $106b_2$ needs to be greater than the elasticity of the first portions 106a.

Besides, in the previous embodiments, the sealant 106 includes the first portions 106a and the second portions 106b, and the first and second portions 106a and 106b are connected to form a closed-ended ring-shaped pattern. In another embodiment of the invention, the sealant can also include a ring-shaped portion and a plurality of auxiliary portions.

Figure 5A:
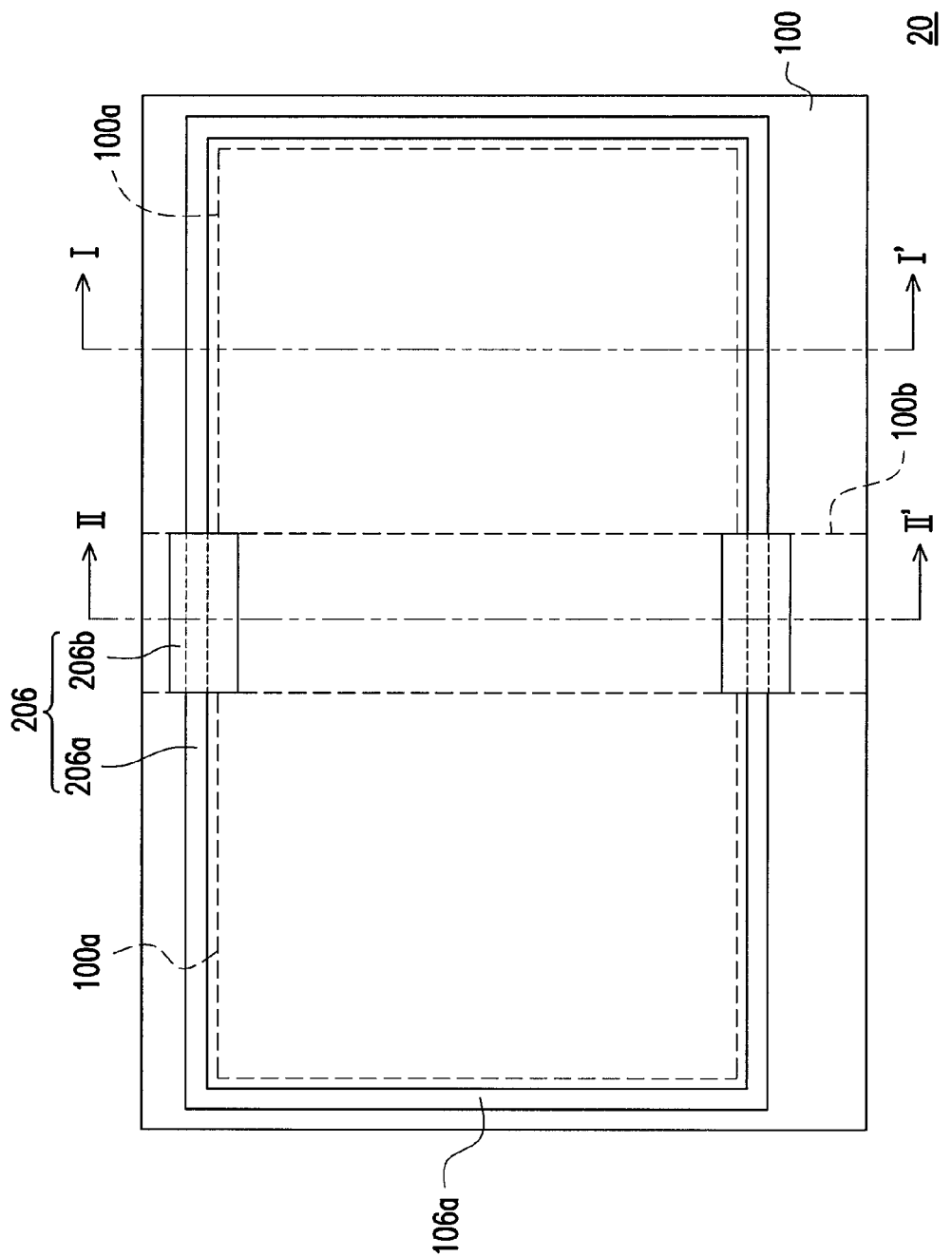
FIG. 5A is a schematic top view illustrating a flexible display panel according to another embodiment of the invention.
Figure 5B:
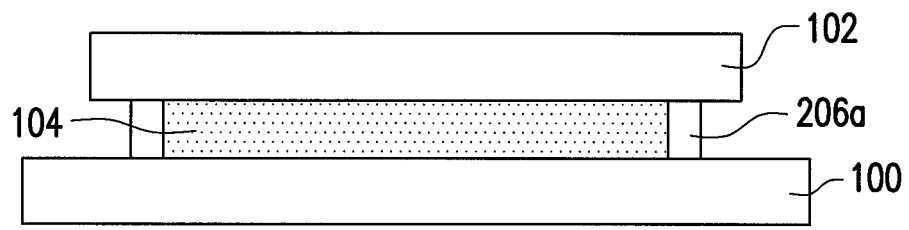
FIG. 5B is a schematic cross-sectional view illustrating the flexible display panel taken along a section I-I' depicted in FIG. 5A.
Figure 5C:
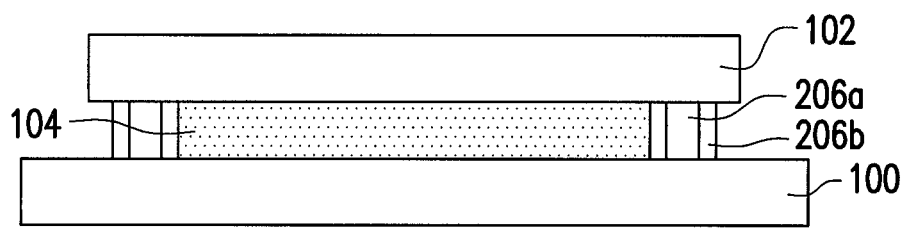
FIG. 5C is a schematic cross-sectional view illustrating the flexible display panel taken along a section II-II' depicted in FIG. 5A.

FIG. 5A is a schematic top view illustrating a flexible display panel according to another embodiment of the invention. FIG. 5B is a schematic cross-sectional view illustrating the flexible display panel taken along a section I-I' depicted in FIG. 5A. FIG. 5C is a schematic cross-sectional view illustrating the flexible display panel taken along a section II-II' depicted in FIG. 5A. To clearly illustrate the invention, an upper substrate and a display medium located between the upper substrate and a lower substrate are omitted in FIG. 5A. Besides, similar elements in FIG. 5A to FIG. 5C and in FIG.

1A to FIG. 1C are represented by the same reference numbers and thus are not further described herein. With reference to FIG. 5A, FIG. 5B, and FIG. 5C, in the flexible display panel 20, the sealant 206 includes a ring-shaped portion 206a and a plurality of auxiliary portions 206b. The ring-shaped portion 206a surrounds the display medium 104. The auxiliary portions 206b cover the ring-shaped portion 206a and are exclusively distributed in the foldable area 100b. Similarly, to prevent the sealant 206 in the foldable area 100b from being damaged by the excessive stress when the flexible display panel 20 is bent, the elasticity of the sealant 206 in the foldable area 100b needs to be greater than the elasticity of the sealant 206 in the non-foldable areas 100a. That is to say, the Young's modulus of the ring-shaped portion 206a needs to be greater than the Young's modulus of the auxiliary portions 206b. The Young's modulus of the ring-shaped portion 206a ranges from about 1000 MPa to about 10000 MPa, for instance, preferably from about 3000 MPa to about 8000 MPa, for instance. The Young's modulus of the auxiliary portions 206b ranges from about 10 MPa to about 1000 MPa, for instance, preferably from about 50 MPa to about 500 MPa. A material of the ring-shaped portion 206a is different from a material of the auxiliary portions 206b. The material of the ring-shaped portion 206a is epoxy or silicon, for instance. The material of the auxiliary portions 206b is a sealing material, such as acrylic, silicon or rubber. The materials of the first and second are not limited to those mentioned above. For instance, the material of the first portions 106a is styrenic block copolymer, ethylene vinyl-acetate or amorphous polyolefin. The material of the second portions 106b is epoxy mixed with rubber, silicon or acrylic, etc. Alternatively, the ring-shaped portion 206a can be a ring-type double sided tape, and the auxiliary portions 206b can be flexible tapes.

In this embodiment, the width of the ring-shaped portion 206a in the foldable area 100b is substantially equal to the width of the ring-shaped portion 206a in the non-foldable areas 100a. In another embodiment, the width of the ring-shaped portion 206a in the foldable area 100b is smaller than the width of the ring-shaped portion 206a in the non-foldable areas 100a.

In addition, the ring-shaped portion 206a is located between the first flexible substrate 100 and the second flexible substrate 102, and so are the auxiliary portions 206b made of the sealing materials as above mentioned.

Figure 6A:
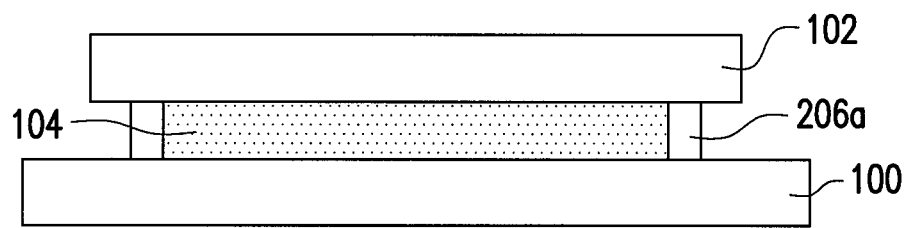
FIG. 6A is a schematic cross-sectional view illustrating the flexible display panel taken along the section I-I' depicted in FIG. 5A according to another embodiment of the invention.
Figure 6B:
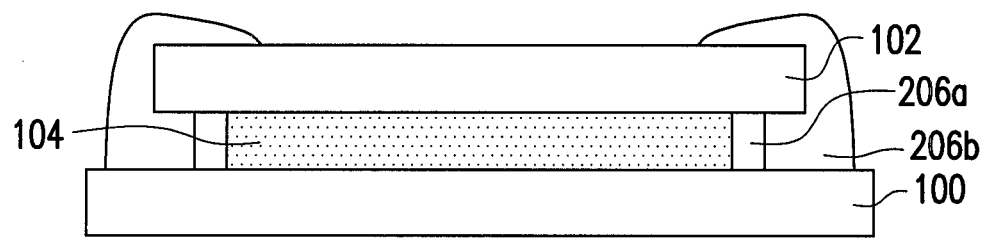
FIG. 6B is a schematic cross-sectional view illustrating the flexible display panel taken along the section II-II' depicted in FIG. 5A according to another embodiment of the invention.

In another embodiment, the ring-shaped portion 206a is located between the first flexible substrate 100 and the second flexible substrate 102, and the auxiliary portions 206b made of the sealing materials as above mentioned are located on the first flexible substrate 100 and cover the sidewall of the display medium 104 and the sidewall of the second flexible substrate 102, as shown in FIG. 6A and FIG. 6B.

Figure 7A:
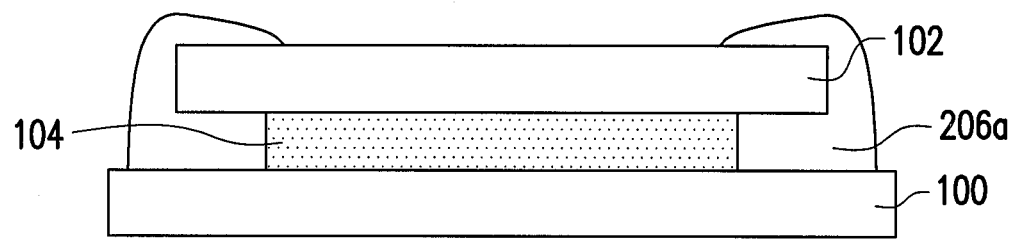
FIG. 7A is a schematic cross-sectional view illustrating the flexible display panel taken along the section I-I' depicted in FIG. 5A according to another embodiment of the invention.
Figure 7B:
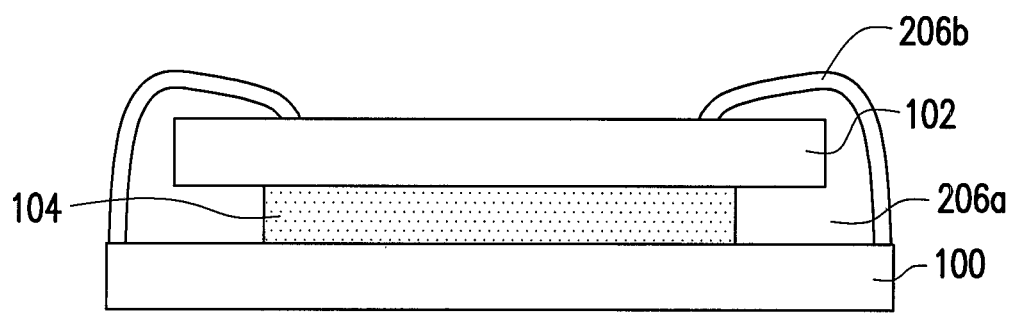
FIG. 7B is a schematic cross-sectional view illustrating the flexible display panel taken along the section II-II' depicted in FIG. 5A according to another embodiment of the invention.

Alternatively, the ring-shaped portion 206a and the auxiliary portions 206b can be both located on the first flexible substrate 100 and cover the sidewall of the display medium 104 and the sidewall of the second flexible substrate 102 in still another embodiment of the invention, as indicated in FIG. 7A and FIG. 7B.

In light of the foregoing, in the flexible display panel described in the embodiments of the invention, the elasticity of the sealant located in the foldable area is greater than the elasticity of the sealant located in the non-foldable areas. Hence, when the flexible display panel is bent, the sealant located in the foldable area can sustain large stress and is thus not damaged, so as to prevent moisture from entering the flexible display panel through the damaged sealant. As such, reliability of the product can be improved effectively.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flexible display panel comprising:
   a first flexible substrate having a plurality of non-folding areas and at least one folding area located between the non-folding areas, the non-folding areas being separated;
   a second flexible substrate configured above the first flexible substrate;
   a display medium configured between the first flexible substrate and the second flexible substrate; and
   a sealant configured on the first flexible substrate to surround the display medium, wherein elasticity of the sealant in the at least one folding area is greater than elasticity of the sealant in the non-folding areas, wherein the sealant comprises:
     a plurality of first portions distributed in the non-folding areas, the first portions being separated; and
     a plurality second portions connected to the first portions and distributed in the at least one folding area, wherein the first portions and the second portions together constitute a close-ended ring-shaped pattern, wherein there is no sealant in the display medium.

2. The flexible display panel as claimed in claim 1, wherein a material of the first portions is different from a material of the second portions.

3. The flexible display panel as claimed in claim 2, wherein the first portions are not distributed in the at least one foldable area.

4. The flexible display panel as claimed in claim 2, wherein a connection region between the first portions and the second portions is located at a boundary of the at least one foldable area.

5. The flexible display panel as claimed in claim 2, wherein the second portions are exclusively distributed in the at least one foldable area.

6. The flexible display panel as claimed in claim 2, wherein a Young's modulus of the first portions is greater than a Young's modulus of the second portions.

7. The flexible display panel as claimed in claim 2, wherein a Young's modulus of the first portions ranges from about 1000 MPa to about 10000 MPa, and a Young's modulus of the second portions ranges from about 10 MPa to about 1000 MPa.

8. The flexible display panel as claimed in claim 2, wherein a Young's modulus of the first portions ranges from about 3000 MPa to about 8000 MPa, and a Young's modulus of the second portions ranges from about 50 MPa to about 500 MPa.

9. The flexible display panel as claimed in claim 2, wherein the first portions are located between the first flexible substrate and the second flexible substrate, or the first portions are located on the first flexible substrate and cover a sidewall of the display medium and a sidewall of the second flexible substrate.

10. The flexible display panel as claimed in claim 9, wherein the second portions are located on the first flexible substrate and cover a sidewall of the display medium and a sidewall of the second flexible substrate.

11. The flexible display panel as claimed in claim 9, wherein each of the second portions is a double sided tape located between the first flexible substrate and the second flexible substrate.

12. The flexible display panel as claimed in claim 9, wherein each of the second portions is a flexible tape.

13. The flexible display panel as claimed in claim 2, wherein a width of each of the first portions is smaller than a width of each of the second portions.

14. A flexible display panel comprising:
   a first flexible substrate having a plurality of non-folding areas and at least one folding area located between the non-folding areas, the non-folding areas being separated;
   a second flexible substrate configured above the first flexible substrate;
   a display medium configured between the first flexible substrate and the second flexible substrate; and
   a sealant configured on the first flexible substrate to surround the display medium, wherein elasticity of the sealant in the at least one folding area is greater than elasticity of the sealant in the non-folding areas, and wherein the sealant is in the periphery of the display medium.

15. The flexible display panel as claimed in claim 14, wherein the sealant is surrounded the display medium in a non-display medium area.

16. The flexible display panel as claimed in claim 14, wherein the sealant comprises:
   a ring-shaped portion surrounding the display medium; and
   a plurality of auxiliary portions covering the ring-shaped portion and distributed in the at least one foldable area, wherein a material of the ring-shaped portion is different from a material of each of the auxiliary portions.

17. The flexible display panel as claimed in claim 16, wherein the auxiliary portions are exclusively distributed in the at least one foldable area.

18. The flexible display panel as claimed in claim 16, wherein a Young's modulus of the ring-shaped portion is greater than a Young's modulus of each of the auxiliary portions.

19. The flexible display panel as claimed in claim 16, wherein each of the auxiliary portions is a sealing material.

20. The flexible display panel as claimed in claim 19, wherein each of the auxiliary portions is a flexible tape.

* * * * *